(12) United States Patent
Schacht et al.

(10) Patent No.: US 8,749,272 B1
(45) Date of Patent: Jun. 10, 2014

(54) APPARATUS AND METHOD FOR THREE-LEVEL INPUT DETECTION

(71) Applicant: Texas Instruments Deutschland GmbH, Freising (DE)

(72) Inventors: Ulrich Schacht, Lower Saxony (DE); Oliver Piepenstock, Lower Saxony (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 13/890,819

(22) Filed: May 9, 2013

(51) Int. Cl.
*G01R 19/00* (2006.01)
*H03K 19/094* (2006.01)
*H03K 19/082* (2006.01)

(52) U.S. Cl.
CPC ...... *H03K 19/09425* (2013.01); *H03K 19/0823* (2013.01)
USPC .................. 327/28; 327/333; 326/57; 326/58

(58) Field of Classification Search
USPC ............... 327/28, 29, 30, 80, 81, 18, 20, 199, 327/207, 210, 214, 319, 333; 326/57, 58
See application file for complete search history.

(56) References Cited

U.S. PATENT DOCUMENTS

| 4,160,194 A * | 7/1979 | Anderson et al. ............. 315/366 |
| 5,194,766 A * | 3/1993 | Sugawara ........................ 326/60 |
| 5,479,114 A * | 12/1995 | Miura ............................... 326/60 |
| 2006/0091924 A1* | 5/2006 | Yamamoto et al. ........... 327/205 |

* cited by examiner

*Primary Examiner* — Lincoln Donovan
*Assistant Examiner* — Jung H Kim
(74) *Attorney, Agent, or Firm* — Alan A. R. Cooper; W. James Brady, III; Frederick J. Telecky, Jr.

(57) ABSTRACT

The present disclosure relates to an Apparatus comprising at least one resistive voltage divider and at least two inverters, wherein the resistive voltage divider is coupled between a first supply potential terminal (VDD) and a second supply potential terminal (VSS), wherein the voltage divider comprises a first resistor, a second resistor, a third resistor and a fourth resistor being serially connected, and wherein a first connection point of the second resistor and the third resistor is connected to an voltage input, and a second connection point of the first resistor and the second resistor is connected to the input side of a first inverter, and a third connection point of the third resistor and the fourth resistor is connected to the input side of a second inverter, wherein the first inverter and the second inverter are configured to provide a first output voltage if a first voltage is applied to the voltage input, and the first inverter and the second inverter are configured to provide a second output voltage if a second voltage is applied to the voltage input, and the first inverter is configured to provide the second output voltage and the second inverter is configured to provide the first output voltage if an open input is applied to the voltage input as well as a method.

24 Claims, 2 Drawing Sheets

APPARATUS AND METHOD FOR THREE-LEVEL INPUT DETECTION

TECHNICAL FIELD

This disclosure relates to an apparatus configured to detect three different voltage inputs, and in particular to apparatus and methods for detecting if a first voltage, a second voltage or an open input is applied to a voltage input. More specifically, the examples of the present disclosure relate to detecting if a first voltage, a second voltage or an open input is applied to a voltage input of a circuit comprising at least to inverters.

BACKGROUND

Digital electronics represent signals by discrete bands of analog levels. All levels within a band represent the same signal state. The number of these states is two in general, and they are represented by two voltage bands: one near a reference value (typically termed as "ground" or zero volts) and a value near the supply voltage, corresponding to the "false" ("0") and "true" ("1") values of the Boolean domain respectively.

According to the state of the art, for providing a supply voltage first supply potential terminal (VDD) and second supply potential terminal (VSS) are used. In most cases, VDD is 5V or 3.3V and VSS is 0V, resulting in VDD representing "true" and VSS representing "false". In the alternative, VDD may for example be 2.5V, 1.8V or other common voltage values.

In digital logic, an inverter or NOT gate is a logic gate which implements logical negation. An inverter circuit outputs a voltage representing the opposite logic-level to its input.

Such inverters can be constructed using a single NMOS transistor or a single PMOS transistor coupled with a resistor or using two complementary transistors in a CMOS configuration. A CMOS input should always be connected to VDD or VSS according to the state of the art. Because the input impedance of a CMOS is very high, the output will be unstable if the input is left open. Moreover, it may lead to increased consumption current due to the through current or malfunction. Therefore, in most cases so called pull-up or pull-down resistors are used to provide a "true" at the valid input of an inverter in case of an open input is applied.

The truth table of inverters according to the state of the art is therefore that a "true" at the input of the inverter results in a "false" at the output of the inverter, a "false" at the input of the inverter results in a "true" at the output of the inverter. An open input results in a "true" at the input of the inverter if a pull-up resistor is used and in a "false" at the output of the inverter.

One disadvantage of the detecting input signals is therefore, that only to two levels corresponding to "true" and "false" can be detected, while open inputs have to be avoided.

It is therefore one objective of the present disclosure to provide an apparatus and a method for improving the detection of inputs. Moreover, it is one objective of the present disclosure to provide an apparatus and a method for three-level input detection.

SUMMARY

One aspect of the present disclosure is an apparatus comprising at least one resistive voltage divider and at least two inverters, wherein the resistive voltage divider may be coupled between a first supply potential terminal (VDD) and a second supply potential terminal (VSS). The voltage divider comprises a first resistor, a second resistor, a third resistor and a fourth resistor being serially connected, and wherein a first connection point of the second resistor and the third resistor may be connected to an voltage input, and a second connection point of the first resistor and the second resistor may be connected to the input side of a first inverter, and a third connection point of the third resistor and the fourth resistor may be connected to the input side of a second inverter. The first inverter and the second inverter may be configured to provide a first output voltage if a first voltage may be applied to the voltage input and a second output voltage if a second voltage may be applied to the voltage input. Furthermore, according to one example of the present disclosure the first inverter may be configured to provide the second output voltage and the second inverter may be configured to provide the first output voltage if an open input may be applied to the voltage input.

According to one example of the present disclosure, with the help of the first and the second inverter a three-level input detection may be provided. The first input voltage may represent logic "true" and the second input voltage may present logic "false". The first output voltage of the first and the second invert may represent logic "high" and the second output voltage of the first and the second inverter may represent logic "low". With the present example of an apparatus according to the disclosure there are three possible combinations of output voltages of the first and second inverter. In case of the first input voltage that may be applied to the voltage input both inverters may have an output voltage representing logic "low". In case of the second input voltage that may be applied to the voltage input both inverters may have an output voltage representing logic "high". And in case an open input may be applied to the voltage input, the first inverter may have an output voltage representing logic "high" and the second inverter may have an output voltage representing logic "low". The apparatus according to the present example can therefore differentiate between a first voltage, a second voltage and an open input applied to the first input.

According to one example of the present disclosure, the first voltage and the first supply voltage may be 5V or 3.3 V and the second voltage and the second supply voltage may be 0V.

According to one example of the present disclosure, the voltage divider may comprise a resistor array of a plurality of serially connected resistors, which form the first resistor, the second resistor, the third resistor and the fourth resistor.

According to one example of the present disclosure, the voltage divider is a high impedance voltage divider. According to further example of the present disclosure, the first, second, third and fourth resistor may have the same resistance or different resistances.

In case of all four resistors having the same resistance and the first voltage that may be applied to the voltage being VDD and the second voltage that may be applied to the voltage input being VSS, and VSS being zero voltage, following voltages at the input side of the first and the second inverter may be applied: In case of VDD may be applied to the voltage input, VDD is applied to the input side of the first inverter and half the voltage of VDD (VDD/2) is applied the input side of the second inverter. In case of VSS may be applied to the voltage input, VDD/2 is applied to the input side of the first inverter and VSS is applied the input side of the second inverter. The signal threshold level of the first and the second inverter may be chosen to configure the first inverted to provide an output voltage representing a logic "low" if VDD is applied to the input side of the first inverter and to provide output voltage representing a logic "high" if VDD/2 is applied and to configure the second inverted to provide an output voltage representing a logic "low" if VDD/2 is applied to the input side of the second inverter and to provide output voltage representing a logic "high" if VSS is applied. In this example, the first inverter and the second inverter may be operated with different supply voltages. In case of the four resistors having different resistances, the first inverter and the second inverter may be operated with the same supply voltage potential.

According to an example of the present disclosure, the first inverter may be coupled between VDD and a third supply potential terminal (VDD/2) and the second inverter may be coupled between VDD/2 and VSS, VDD/2 providing half the supply voltage of VDD.

Providing half the voltage of VDD to the first and the second inverter may result in a reduction of cross current and therefore in a reduction of power consumption. The first output voltage of the first inverter may therefore be VDD/2 and the second output voltage of the first inverter may be VDD. The first output voltage of the second inverter may therefore VSS and the second output voltage of the second inverter may be VDD/2.

According to a further example of the present disclosure, the output side of the first inverter may be connected to an input side of a third inverter and to a first input of a first level shifter and the output side of the third inverter may be connected to a second input of the first level shifter and the output side of the second inverter may be connected to an input side of a fourth inverter and to a first input of a second level shifter and the output side of the fourth inverter may be connected to a second input of the second level shifter.

According to a further example of the present disclosure, the first and the second level shifter may be configured to provide an output voltage being the first or the second voltage. In particular, the first and the second level shifter may be operated with a supply voltage of VDD to VSS.

Therefore, with the help of the first and the second level shifters the output voltages of the first and the second inverter may be converted to the VDD to VSS power domain.

According to one example of the present disclosure, the third inverter may coupled between VDD and a third supply potential terminal (VDD/2) and the fourth inverter may coupled between VDD/2 and VSS, VDD/2 having half the supply voltage of VDD.

According to this example, VDD or VDD/2 may be applied at the first voltage input and the second voltage input of the first level shifter alternately. If the voltage output of the first inverter is VDD/2, the voltage output of the third inverter is VDD and the other way round. Furthermore, VDD/2 or VSS may be applied at the first voltage input and the second voltage input of the second level shifter alternately. If the voltage output of the second inverter is VDD/2, the voltage output of the fourth inverter is VSS and the other way round again.

According to one example of the present disclosure, the first, the second, the third and the fourth inverter comprises a Complementary metal-oxide-semiconductor (CMOS). CMOS inverters may have a low power consumption compared to other possible realizations of inverters.

According to an alternative example of the present disclosure the first, the second, the third and the fourth inverter comprises a resistor and an n-channel metal-oxide-semiconductor field-effect transistor (NMOS) or a p-channel metal-oxide-semiconductor field-effect transistor (PMOS), the resistor and the NMOS or PMOS may be serially connected.

Thereby, according to one example of the present disclosure the second connection point may be connected to the gate of the NMOS or PMOS of the first inverter and the third connection point may connected to the gate of the NMOS or PMOS of the second inverter and the output side of the first inverter may be connected to the gate of the NMOS or PMOS of the third inverter and the output side of the second inverter may connected to the gate of the NMOS or PMOS of the fourth inverter.

In one example, an apparatus according to the present disclosure may be operated by applying a supply voltage to the voltage divider, to the first and the second inverter, and applying a first voltage, a second voltage or an open input to the voltage input, and detecting if a first voltage, a second voltage or an open input is applied to the voltage input by comparing if the output voltages of the first inverter is VDD or VDD/2 and if the output voltage of the second inverter is VDD/2 or VSS.

Moreover, according to one example of the present disclosure it may be of advantage to providing an output voltage of VDD and VSS at a first and a second voltage output of the apparatus by providing two level shifters having a supply voltage of VDD to VSS and converting the output voltage of the first inverter from VDD/2 to VDD and from VDD to VSS by applying the output voltage of the first inverter to the input of a third inverter and to a first input of a first level shifter and the output voltage of the third inverter to a second input of the first level shifter and connecting the output of the first level shifter to the first voltage output and converting the output voltage of the first inverter from VSS to VDD and from VDD/2 to VSS by applying the output voltage of the second inverter to the input of a fourth inverter and to a first input of a second level shifter and the output voltage of the fourth inverter to a second input of the second level shifter and connecting the output of the second level shifter to the second voltage output.

According to a further example of the present disclosure, it may be of advantage detecting the first voltage being applied to the voltage input if the output voltage of the first and the second voltage output is VSS, and detecting the second voltage being applied to the voltage input if the output voltage of the second voltage output is VSS, and detecting the open input being applied to the voltage input if the output voltage of the first voltage output is VSS and the output voltage of the second voltage output is VDD.

DESCRIPTION OF THE DRAWINGS

Reference is now made to the following descriptions.

DETAILED DESCRIPTION OF THE DRAWINGS

While illustrative examples are illustrated and described below, it will be appreciated that various changes can be made therein without departing from the spirit and scope of the disclosure. In that regard, the detailed description set forth below, in connection with the appended drawings is intended only as a description of various examples of the disclosed subject matter and is not intended to represent the only examples. Each example described in this disclosure is provided merely as an example or illustration and should not be construed as preferred or advantageous over other examples. The illustrative examples provided herein are not intended to be exhaustive or to limit the disclosure to the precise forms disclosed. Similarly, any steps described herein may be interchangeable with other steps, or combinations of steps, in order to achieve the same or substantially similar result.

Figure 1:
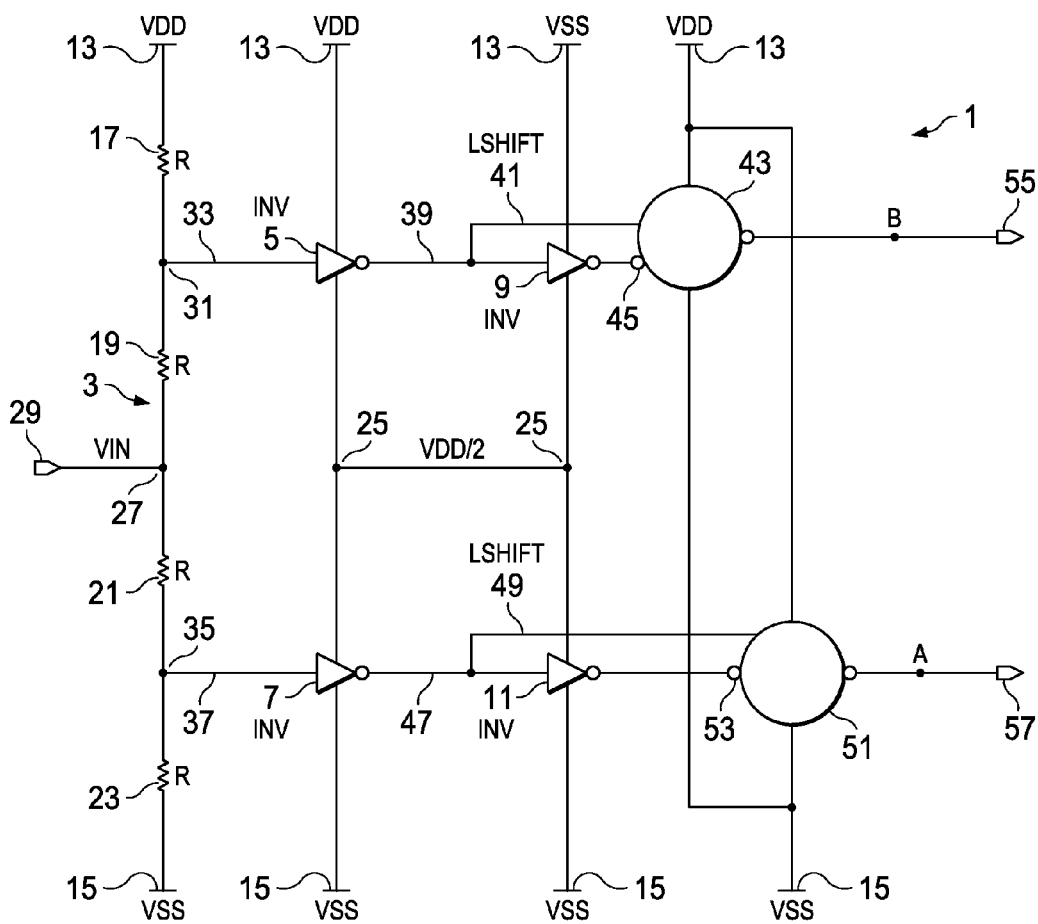
FIG. 1 is a schematic diagram illustrating one example of an apparatus of the present disclosure.

Examples of the present disclosure may be practiced with an apparatus shown in FIG. 1. An apparatus 1 comprises one resistive voltage divider 3 and four inverters 5, 7, 9, 11, in particular the four inverters 5, 7, 9, 11 comprising a Complementary metal-oxide-semiconductor each. The resistive voltage divider 3 is coupled between a first supply potential terminal (VDD) 13 and a second supply potential terminal (VSS) 15. The voltage divider 3 comprises a first resistor 17, a second resistor 19, a third resistor 21 and a fourth resistor 23 having the different resistances and being serially connected.

The first inverter 5 is coupled between VDD 13 and a third supply potential terminal (VDD/2) 25 and the second inverter is coupled between VDD/2 25 and VSS 15, VDD/2 may have half the supply voltage of VDD.

According to the present example, the third inverter 9 is coupled between VDD and VDD/2 and the fourth inverter 11 is coupled between VDD/2 and VSS.

The first voltage and the first supply voltage of VDD 13 may be 5V or 3.3 V and the second voltage and the second supply voltage may be VSS 15 is 0V in one example of the present disclosure.

A first connection point 27 of the second resistor 19 and the third resistor 21 may be connected to an voltage input 29, and a second connection point 31 of the first resistor 17 and the second resistor 19 may be connected to the input side 33 of the first inverter 5. Furthermore, a third connection point 35 of the third resistor 21 and the fourth resistor 23 may connected to the input side 37 of the second inverter 7. The first inverter 5 and the second inverter 7 are configured to provide a first output voltage if a first voltage is applied to the voltage input 29, and the first inverter and the second inverter 5, 7 are configured to provide a second output voltage if a second voltage is applied to the voltage input 29.

According to one example of the present disclosure, the first inverter 5 may be configured to provide the second output voltage and the second inverter 7 may be configured to provide the first output voltage if an open input is applied to the voltage input 29.

The output side of the first inverter 5 may be connected to an input side 39 of the third inverter 9 and to a first input 41 of a first level shifter 43 and the output side of the third inverter 9 is connected to a second input 45 of the first level shifter 43. Furthermore, according to the present example the output side of the second inverter 7 may be connected to an input side 47 of the fourth inverter 11 and to a first input 49 of a second level shifter 51 and the output side of the fourth inverter 11 may be connected to a second input 53 of the second level shifter 51. The first and the second level shifter may be have a power supply of VDD to VSS and may be configured to provide an output voltage being VDD or VSS.

The voltage output of the first level shifter 43 may be connected to a first voltage output 55 and the voltage output of the second level shifter 51 may be connected to a second voltage output 57.

Figure 2:
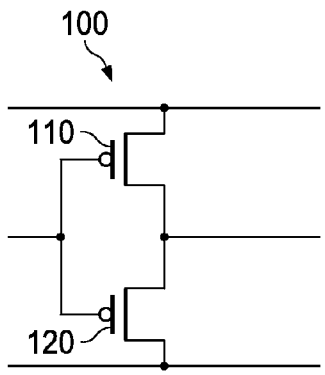
FIG. 2 is an example of an inverter according to the present disclosure.
Figure 3:
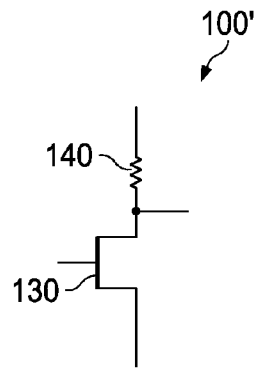
FIG. 3 is another example of an inverter according to the present disclosure.
Figure 4:
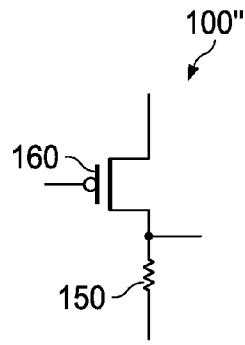
FIG. 4 is another example of an inverter according to the present disclosure.

FIGS. 2 to 4 show examples of inverters according to the present disclosure. FIG. 2 shows an inverter 100 comprising two metal-oxide-semiconductor field-effect transistors (MOSFET) 110, 120 forming a complementary MOSFET (CMOS).

FIG. 3 shows an inverter 100' comprising an n-type metal-oxide-semiconductor (NMOS) 130 and a resistor 140. FIG. 4 shows an inverter 100" comprising a p-type metal-oxide-semiconductor (PMOS) 160 and a resistor 150.

Figure 5:
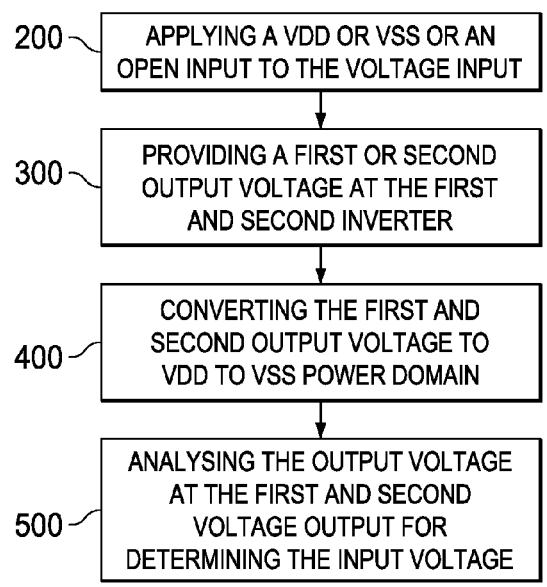
FIG. 5 is a flow chart illustrating one example of a method of the present disclosure

FIG. 5 shows a flow chart of a method for a three-level input detection according to the present disclosure.

An apparatus to be operated by the method according to the present disclosure may comprise an voltage input, a voltage divider comprising a first resistor, a second resistor, a third resistor and a fourth resistor being serially connected, the resistive voltage divider may be coupled between a first supply potential terminal (VDD) and a second supply potential terminal (VSS), and at least two inverters, wherein the first inverter may be coupled between VDD and a third supply potential terminal (VDD/2) and the second inverter may be coupled between VDD/2 and VSS, and wherein a first connection point of the second resistor and the third resistor may be connected to the voltage input, and a second connection point of the first resistor and the second resistor may be connected to the input side of a first inverter, and a third connection point of the third resistor and the fourth resistor may be connected to the input side of a second inverter.

According to one example of the method, in a first step a supply voltage may be applied to the voltage divider, to the first inverter and to the second inverter. In a next step, a first voltage, a second voltage or an open input may be applied to the voltage input. The applied input voltage or the applied open input at the voltage input results in a first or second output voltage at the first and second inverter.

An output voltage of VDD and VSS may be provided at a first and a second voltage output of the apparatus by providing two level shifters having a supply voltage of VDD to VSS and converting the output voltage of the first inverter from VDD/2 to VDD and from VDD to VSS by applying the output voltage of the first inverter to the input of a third inverter and to a first input of a first level shifter and the output voltage of the third inverter to a second input of the first level shifter and connecting the output of the first level shifter to the first voltage output and converting the output voltage of the first inverter from VSS to VDD and from VDD/2 to VSS by applying the output voltage of the second inverter to the input of a fourth inverter and to a first input of a second level shifter and the output voltage of the fourth inverter to a second input of the second level shifter and connecting the output of the second level shifter to the second voltage output.

According to one example of the present disclosure, in the next step may be detecting the first voltage being applied to the voltage input if the output voltage of the first and the second voltage output is VSS, detecting the second voltage being applied to the voltage input if the output voltage of the second voltage output is VSS, and detecting the open input being applied to the voltage input if the output voltage of the first voltage output is VSS and the output voltage of the second voltage output is VDD.

According to one example of the present disclosure, the first voltage and the supply voltage of VDD is 5V or 3.3V and the second voltage and the supply voltage of VSS is 0V, wherein supply voltage of VDD/2 is half the supply voltage of VDD. It is obvious for those skilled in the art that VDD may be 2.5V, 1.8V or another suitable voltage.

Those skilled in the art to which this application relates will appreciate that other and further additions, deletions, substitutions and modifications may be made to the described embodiments.

What is claimed is:

1. Apparatus comprising:
   at least one resistive voltage divider; and
   at least two inverters; wherein
   the resistive voltage divider is coupled between a first supply potential terminal (VDD) and a second supply potential terminal (VSS), wherein the voltage divider comprises a first resistor, a second resistor, a third resistor and a fourth resistor being serially connected, and wherein
   a first connection point of the second resistor and the third resistor is connected to a voltage input, and
   a second connection point of the first resistor and the second resistor is connected to the input side of a first inverter, and
   a third connection point of the third resistor and the fourth resistor is connected to the input side of a second inverter, wherein
   the first inverter and the second inverter are configured to provide a first output logic state if a first voltage is applied to the voltage input, and
   the first inverter and the second inverter are configured to provide a second output logic state if a second voltage is applied to the voltage input, and
   the first inverter is configured to provide the second output logic state and the second inverter is configured to provide the first output logic state if an open input is applied to the voltage input.

2. The apparatus according to claim 1, characterized in that the voltage divider comprises a resistor array of a plurality of serially connected resistors, which form the first resistor, the second resistor, the third resistor and the fourth resistor.

3. The apparatus according to claim 1, characterized in that the first, second, third and fourth resistor have the same resistance or different resistances.

4. The apparatus according to claim 1, characterized in that a voltage source is connectable to the voltage input, wherein the voltage source is configured to apply the first voltage, the second voltage and an open input to the voltage input subsequently.

5. The apparatus according to claim 4, characterized in that the voltage source is a microcontroller.

6. The apparatus according to claim 1, characterized in that a first supply voltage source is connectable to VDD, wherein the first supply voltage source is configured to apply the first voltage to VDD.

7. The apparatus according to claim 1, characterized in that a second supply voltage source is connectable to VSS, wherein the second supply voltage source is configured to apply the second voltage to VSS.

8. The apparatus according to claim 1, characterized in that the first voltage and the first supply voltage is 5V, 3.3V, 2.5V, or 1.8 V and the second voltage and the second supply voltage is 0V.

9. The apparatus according to claim 1, characterized in that the output side of the first inverter is connected to an input side of a third inverter and to a first input of a first level shifter and the output side of the third inverter is connected to a second input of the first level shifter and
   the output side of the second inverter is connected to an input side of a fourth inverter and to a first input of a second level shifter and the output side of the fourth inverter is connected to a second input of the second level shifter.

10. The apparatus according to claim 9, characterized in that the first and the second level shifters are configured to provide an output voltage being the first or the second voltage.

11. The apparatus according to claim 10, characterized in that the first and the second level shifter being operated with a supply voltage of VDD to VSS.

12. The apparatus according to claim 9, characterized in that the first inverter is coupled between VDD and a third supply potential terminal (VDD/2) and the second inverter is coupled between VDD/2 and VSS, VDD/2 providing half the supply voltage of VDD.

13. The apparatus according to claim 9, characterized in that the third inverter is coupled between VDD and a third supply potential terminal (VDD/2) and the fourth inverter is coupled between VDD/2 and VSS, VDD/2 providing half the supply voltage of VDD.

14. The apparatus according to claim 9, characterized in that each of the first, the second, the third and the fourth inverter comprises a resistor and a n-channel metal-oxide-semiconductor field-effect transistor (NMOS) or a p-channel metal-oxide-semiconductor field-effect transistor (PMOS), the resistor and the NMOS or PMOS being serially connected.

15. The apparatus according to claim 14, characterized in that the second connection point is connected to the gate of the NMOS or PMOS of the first inverter and the third connection point is connected to the gate of the NMOS or PMOS of the second inverter and the output side of the first inverter is connected to the gate of the NMOS or PMOS of the third inverter and the output side of the second inverter is connected to the gate of the NMOS or PMOS of the fourth inverter.

16. The apparatus according to claim 1, characterized in that each of the first, the second, the third and the fourth inverter comprises a Complementary metal-oxide-semiconductor (CMOS).

17. Apparatus comprising:
    at least one resistive voltage divider; and
    at least four inverters comprising a Complementary metal-oxide-semiconductor; wherein
    the resistive voltage divider is coupled between a first supply potential terminal (VDD) and a second supply potential terminal (VSS), wherein the voltage divider comprises a first resistor, a second resistor, a third resistor and a fourth resistor having the same resistance or different resistances and being serially connected, and wherein
    the first inverter is coupled between VDD and a third supply potential terminal (VDD/2) and the second inverter is coupled between VDD/2 and VSS, VDD/2 having half the supply voltage of VDD, and wherein
    the first voltage and the first supply voltage of VDD is 5V, 3.3 V, 2.5V or 1.8V and the second voltage and the second supply voltage of VSS is 0V, and
    a first connection point of the second resistor and the third resistor is connected to a voltage input, and
    a second connection point of the first resistor and the second resistor is connected to the input side of a first inverter, and
    a third connection point of the third resistor and the fourth resistor is connected to the input side of a second inverter, wherein
    the first inverter and the second inverter are configured to provide a first output logic state if the first voltage is applied to the voltage input, and
    the first inverter and the second inverter are configured to provide a second output logic state if the second voltage is applied to the voltage input, and the first inverter is configured to provide the second output logic state and the second inverter is configured to provide the first output logic state if an open input is applied to the voltage input, and the output side of the first inverter is connected to an input side of a third inverter and to a first input of a first level shifter and the output side of the third inverter is connected to a second input of the first level shifter and the output side of the second inverter is connected to an input side of a fourth inverter and to a first input of a second level shifter and the output side of the fourth inverter is connected to a second input of the second level shifter, and wherein the first and the second level shifters are configured to provide an output voltage being the first or the second voltage, and the third inverter is coupled between VDD and VDD/2 and the fourth inverter is coupled between VDD/2 and VSS.

18. A method of operating an apparatus comprising a voltage input, a voltage divider comprising a first resistor, a second resistor, a third resistor and a fourth resistor being serially connected, the resistive voltage divider being coupled between a first supply potential terminal (VDD) and a second supply potential terminal (VSS), and at least two inverters, wherein the first inverter is coupled between VDD and a third supply potential terminal (VDD/2) and the second inverter is coupled between VDD/2 and VSS, and wherein a first connection point of the second resistor and the third resistor is connected to the voltage input, and a second connection point of the first resistor and the second resistor is connected to the input side of a first inverter, and a third connection point of the third resistor and the fourth resistor is connected to the input side of a second inverter, the method comprising:

applying a supply voltage to the voltage divider, to the first and the second inverter, and applying a first voltage, a second voltage or an open input to the voltage input, and detecting if the first voltage, the second voltage or the open input is applied to the voltage input by comparing if the output voltage of the first inverter is VDD or VDD/2 and if the output voltage of the second inverter is VDD/2 or VSS.

19. The method according to claim 18, wherein detecting the first voltage being applied to the voltage input if the output voltage of the first inverter is VDD/2 and the output voltage of the second inverter is VSS, and detecting the second voltage being applied to the voltage input if the output voltage of the first inverter is VDD and the output voltage of the second inverter is VDD/2, and detecting the open input being applied to the voltage input if the output voltage of the first inverter is VDD/2 and the output voltage of the second inverter is VDD/2.

20. The method according to claim 18, further comprising providing an output voltage of VDD and VSS at a first and a second voltage output of the apparatus by providing two level shifters having a supply voltage of VDD to VSS and converting the output voltage of the first inverter from VDD/2 to VDD and from VDD to VSS by applying the output voltage of the first inverter to the input of a third inverter and to a first input of a first level shifter and the output voltage of the third inverter to a second input of the first level shifter and connecting the output of the first level shifter to the first voltage output and converting the output voltage of the second inverter from VSS to VDD and from VDD/2 to VSS by applying the output voltage of the second inverter to the input of a fourth inverter and to a first input of a second level shifter and the output voltage of the fourth inverter to a second input of the second level shifter and connecting the output of the second level shifter to the second voltage output.

21. The method according to claim 20, further comprising detecting the first voltage being applied to the voltage input if the output voltage of the first and the second voltage output is VSS, and detecting the second voltage being applied to the voltage input if the output voltage of the first and the second voltage output is VDD, and detecting the open input being applied to the voltage input if the output voltage of the first voltage output is VSS and the output voltage of the second voltage output is VDD.

22. The method according to claim 20, further comprising:

the first voltage and the supply voltage of VDD is 5V, 3.3V, 2.5V or 1.8V and the second voltage and the supply voltage of VSS is 0V, wherein supply voltage of VDD/2 is half the supply voltage of VDD.

23. The method according to claim 19 employing an apparatus according to claim 1.

24. A method of operating an apparatus comprising a voltage input, a voltage divider comprising a first resistor, a second resistor, a third resistor and a fourth resistor being serially connected, the resistive voltage divider being coupled between a first supply potential terminal (VDD) and a second supply potential terminal (VSS), and at least two inverters, wherein the first inverter is coupled between VDD and a third supply potential terminal (VDD/2) and the second inverter is coupled between VDD/2 and VSS, and wherein a first connection point of the second resistor and the third resistor is connected to the voltage input, and a second connection point of the first resistor and the second resistor is connected to the input side of a first inverter, and a third connection point of the third resistor and the fourth resistor is connected to the input side of a second inverter, the method comprising:

applying a supply voltage to the voltage divider, to the first and the second inverter, and applying a first voltage, a second voltage or an open input to the voltage input, and providing an output voltage of VDD and VSS at a first and a second voltage output of the apparatus by providing two level shifters having a supply voltage of VDD to VSS and converting the output voltage of the first inverter from VDD/2 to VDD and from VDD to VSS by applying the output voltage of the first inverter to the input of a third inverter and to a first input of a first level shifter and the output voltage of the third inverter to a second input of the first level shifter and connecting the output of the first level shifter to the first voltage output and converting the output voltage of the first inverter from VSS to VDD and from VDD/2 to VSS by applying the output voltage of the second inverter to the input of a fourth inverter and to a first input of a second level shifter and the output voltage of the fourth inverter to a second input of the second level shifter and connecting the output of the second level shifter to the second voltage output, and detecting the first voltage being applied to the voltage input if the output voltage of the first and the second voltage output is VSS, and detecting the second voltage being applied to the voltage input if the output voltage of the first and the second voltage output is VDD, and detecting the open input being applied to the voltage input if the output voltage of the first voltage output is VSS and the output voltage of the second voltage output is VDD, wherein the first voltage and the supply voltage of VDD is 5V, 3.3V, 2.5V or 1.8V and the second voltage and the supply voltage of VSS is 0V, wherein supply voltage of VDD/2 is half the supply voltage of VDD.

* * * * *